(12) United States Patent
Tian

(10) Patent No.: US 10,504,969 B2
(45) Date of Patent: Dec. 10, 2019

(54) ORGANIC LIGHT EMITTING DIODE PIXEL ARRANGEMENT STRUCTURE AND DISPLAY PANEL

(71) Applicant: Wuhan China Star Optoelectronics Semiconductor Display Technology Co., Ltd., Wuhan (CN)

(72) Inventor: Nian Tian, Wuhan (CN)

(73) Assignee: Wuhan China Star Optoelectronics Semiconductor Display Technology Co., Ltd., Wuhan (CN)

(*) Notice: Subject to any disclaimer, the term of this patent is extended or adjusted under 35 U.S.C. 154(b) by 0 days.

(21) Appl. No.: 16/075,665

(22) PCT Filed: Apr. 27, 2018

(86) PCT No.: PCT/CN2018/084717
§ 371 (c)(1),
(2) Date: Aug. 6, 2018

(87) PCT Pub. No.: WO2019/148678
PCT Pub. Date: Aug. 8, 2019

(65) Prior Publication Data
US 2019/0237520 A1    Aug. 1, 2019

(30) Foreign Application Priority Data
Jan. 30, 2018  (CN) .......................... 2018 1 0090967

(51) Int. Cl.
*H01L 27/32*    (2006.01)
(52) U.S. Cl.
CPC ................................ *H01L 27/3218* (2013.01)

(58) Field of Classification Search
CPC ............................................ H01L 27/32–3218
See application file for complete search history.

(56) References Cited

U.S. PATENT DOCUMENTS

| 2002/0015110 | A1* | 2/2002 | Brown Elliott ...... G09G 3/3607 348/589 |
| 2009/0302331 | A1 | 12/2009 | Smith et al. |
| 2015/0364525 | A1* | 12/2015 | Lin ...................... H01L 27/3213 257/40 |
| 2016/0240593 | A1* | 8/2016 | Gu ........................ G09G 3/3225 |
| 2016/0276416 | A1 | 9/2016 | Ma |
| 2016/0322433 | A1* | 11/2016 | Kim ..................... H01L 27/3216 |
| 2018/0342570 | A1* | 11/2018 | Hong ................... H01L 27/3258 |
| 2018/0366521 | A1 | 12/2018 | Hu et al. |
| 2019/0157361 | A1* | 5/2019 | Lee ...................... H01L 27/3218 |

FOREIGN PATENT DOCUMENTS

| CN | 101449382 | 6/2009 |
| CN | 104037202 | 9/2014 |
| CN | 104112824 | 10/2014 |
| CN | 107240601 | 10/2017 |

* cited by examiner

*Primary Examiner* — Sonya D. McCall-Shepard

(57) ABSTRACT

An organic light emitting diode pixel arrangement structure and a display panel are provided. The organic light emitting diode pixel arrangement structure includes a central area and an edge area located around the central area. In the central area, four sub-pixels are arranged around a corresponding sub-pixel and have at least three different colors. A color of the corresponding sub-pixel is same as a color of one of the four sub-pixels arranged around the corresponding sub-pixel, so as to achieve high resolution display of the display panel.

20 Claims, 3 Drawing Sheets

ORGANIC LIGHT EMITTING DIODE PIXEL ARRANGEMENT STRUCTURE AND DISPLAY PANEL

RELATED APPLICATIONS

This application is a National Phase of PCT Patent Application No. PCT/CN2018/084717 having International filing date of Apr. 27, 2018, which claims the benefit of priority of Chinese Patent Application No. 201810090967.1 filed on Jan. 30, 2018. The contents of the above applications are all incorporated by reference as if fully set forth herein in their entirety.

FIELD AND BACKGROUND OF THE INVENTION

The present disclosure relates to the field of panel display technologies, and more particularly to an organic light emitting diode pixel arrangement structure and a display panel.

In flat panel display technologies, organic light emitting diode (OLED) display devices have many advantages such as lightness, thinness, active light emission, fast response speed, large viewing angles, wide color gamut, high brightness, and low power consumption. The OLED display devices have gradually become the third-generation display technologies behind liquid crystal display devices.

RGB color mode is the industry color standard. Various colors are obtained by changing three color channels of red (R), green (G), and blue (B) and superimposing the three color channels with each other. RGB are colors represent the three color channels of red, green and blue. The color standard includes almost all the colors that human vision can perceive and is one of the most widely used color systems. In conventional OLED fields, three-dot full-color technology is used, that is, a full-color pixel is composed of three-color chips of RGB in one light emitting unit.

However, PenTile technology has greater advantages in processes and costs with display panel trending towards high pixels per inch (PPI) development. PenTile arrangement breaks a limitation of three-in-one light emitting units in a conventional arrangement, and reduces a number of sub-pixels using common sub-pixels in adjacent pixels, so as to achieve low resolution simulation of high resolution. The greatest benefit of the PenTile arrangement improves permeability, higher brightness using less power, battery life, and significant cost savings. Arrangement of sub-pixels determines a complexity of the processes and a display performance. Major panel makers are constantly improving and developing new sub-pixel arrangements to further reduce costs and improve the display performance.

At present, people have higher and higher requirements for exquisiteness of display; however, production of OLED displays with high quality and high resolution still faces many challenges. Fine metal mask (FMM) is one of the most critical technologies that restrict a development of the OLED display devices. With an increase of resolution requirements, production of the FMM is becoming more and more difficult. At present, in a mainstream RGB horizontal and diamond arrangement, each sub-pixel corresponds to an opening of the FMM, in order to avoid color aliasing, a distance between openings of different color sub-pixels has a minimum limit, which restricts a further improvement of the resolution.

It is necessary to provide an organic light emitting diode pixel array structure and a display panel to solve problems existing in existing technologies.

SUMMARY OF THE INVENTION

An object of the present disclosure is to provide an organic light emitting diode pixel arrangement structure with high resolution and a display panel so as to solve low resolution existing in existing OLED display panel.

To achieve the above object, an embodiment of the present disclosure provides an organic light emitting diode pixel arrangement structure including a central area, an edge area located around the central area, a plurality of sub-pixels arranged in an array, and a plurality of space units. In the central area, four sub-pixels are arranged around a corresponding sub-pixel and have at least three different colors, and a color of the corresponding sub-pixel is same as a color of one of the four sub-pixels arranged around the corresponding sub-pixel. A light emitting layer of the corresponding sub-pixel and a light emitting layer of one of the four sub-pixels arranged around the corresponding sub-pixel having a same color as the corresponding sub-pixel are connected to each other. The sub-pixels are arranged in an array of rows and columns. The space units each are disposed between every two adjacent sub-pixels on each row, and the sub-pixels on a row adjacent to a corresponding row are disposed in alignment with the space units on the corresponding row, respectively. A shape of each of the sub-pixels is a circle, a rectangle, a square, or a diamond, and the at least three different colors are red, green, and blue.

In an embodiment of the present disclosure, a plurality of repeating units each are defined by the sub-pixels on two adjacent rows, each repeating unit includes a plurality of sub-pixel groups each composed of two adjacent sub-pixels having a same color, center points of the two adjacent sub-pixels of each of the sub-pixel groups define a straight line, and straight lines defined by the center points of the two adjacent sub-pixels in the sub-pixel groups in a same repeating unit are parallel to each other.

In an embodiment of the present disclosure, the straight lines defined by the center points of the sub-pixels in the sub-pixel groups of every two adjacent repeating units intersect.

In an embodiment of the present disclosure, adjacent three sub-pixel groups in a same repeating unit include sub-pixels having three different color being repeated in order.

An embodiment of the present disclosure provides an organic light emitting diode pixel arrangement structure including a central area, an edge area located around the central area, and a plurality of sub-pixels arranged in an array. In the central area, four sub-pixels are arranged around a corresponding sub-pixel and have at least three different colors, and a color of the corresponding sub-pixel is same as a color of one of the four sub-pixels arranged around the corresponding sub-pixel.

In an embodiment of the present disclosure, a light emitting layer of the corresponding sub-pixel and a light emitting layer of one of the four sub-pixels arranged around the corresponding sub-pixel having a same color as the corresponding sub-pixel are connected to each other.

In an embodiment of the present disclosure, the sub-pixels are arranged in an array of rows and columns.

In an embodiment of the present disclosure, the organic light emitting diode pixel arrangement structure further includes a plurality of space units, wherein the space units each are disposed between every two adjacent sub-pixels on each row, and the sub-pixels on a row adjacent to a corresponding row are disposed in alignment with the space units on the corresponding row, respectively.

In an embodiment of the present disclosure, a plurality of repeating units each are defined by the sub-pixels on two adjacent rows, each repeating unit includes a plurality of sub-pixel groups each composed of two adjacent sub-pixels having a same color, center points of the two adjacent sub-pixels of each of the sub-pixel groups define a straight line, and straight lines defined by the center points of the two adjacent sub-pixels in the sub-pixel groups in a same repeating unit are parallel to each other.

In an embodiment of the present disclosure, the straight lines defined by the center points of the sub-pixels in the sub-pixel groups of every two adjacent repeating units intersect.

In an embodiment of the present disclosure, adjacent three sub-pixel groups in a same repeating unit include sub-pixels having three different color being repeated in order.

In an embodiment of the present disclosure, a shape of each of the sub-pixels is a circle, a rectangle, a square, or a diamond, and the at least three different colors are red, green, and blue.

An embodiment of the present disclosure further provides a display panel including an organic light emitting diode pixel arrangement structure. The organic light emitting diode pixel arrangement structure includes a central area, an edge area located around the central area, and a plurality of sub-pixels arranged in an array. In the central area, four sub-pixels are arranged around a corresponding sub-pixel and have at least three different colors, and a color of the corresponding sub-pixel is same as a color of one of the four sub-pixels arranged around the corresponding sub-pixel.

In an embodiment of the present disclosure, a light emitting layer of the corresponding sub-pixel and a light emitting layer of one of the four sub-pixel arranged around the corresponding sub-pixel having a same color as the corresponding sub-pixel are connected to each other.

In an embodiment of the present disclosure, the sub-pixels are arranged in an array of rows and columns.

In an embodiment of the present disclosure, the display panel further includes a plurality of space units, wherein the space units each are disposed between every two adjacent sub-pixels on each row, and the sub-pixels on a row adjacent to a corresponding row are disposed in alignment with the space units on the corresponding row, respectively.

In an embodiment of the present disclosure, a plurality of repeating units each are defined by the sub-pixels on two adjacent rows, each repeating unit includes a plurality of sub-pixel groups each composed of two adjacent sub-pixels having a same color, center points of the two adjacent sub-pixels of each of the sub-pixel groups define a straight line, and straight lines defined by the center points of the two adjacent sub-pixels in the sub-pixel groups in a same repeating unit are parallel to each other.

In an embodiment of the present disclosure, the straight lines defined by the center points of the sub-pixels in the sub-pixel groups of every two adjacent repeating units intersect.

In an embodiment of the present disclosure, adjacent three sub-pixel groups in a same repeating unit include sub-pixels having three different color being repeated in order.

In an embodiment of the present disclosure, a shape of each of the sub-pixels is a circle, a rectangle, a square, or a diamond, and the at least three different colors are red, green, and blue.

Compared with existing organic light emitting diode pixel array structure and display panel, sub-pixels arrangement of the display panel of the embodiment of the present disclosure can simultaneously manufacture a plurality of sub-pixels using a same fine metal mask, so as to provide the display panel with high resolution and solve low resolution existing in existing OLED display panel.

The accompanying figures to be used in the description of embodiments of the present disclosure will be described in brief to more clearly illustrate the technical solutions of the embodiments.

BRIEF DESCRIPTION OF THE SEVERAL VIEWS OF THE DRAWINGS

FIG. 1 is a schematic structural diagram of a sub-pixel structure of an organic light emitting diode pixel arrangement structure according to a first embodiment of the present disclosure.

FIG. 2 is a schematic structural diagram of a sub-pixel structure of an organic light emitting diode pixel arrangement structure according to a second embodiment of the present disclosure.

DESCRIPTION OF SPECIFIC EMBODIMENTS OF THE INVENTION

Figure 3:
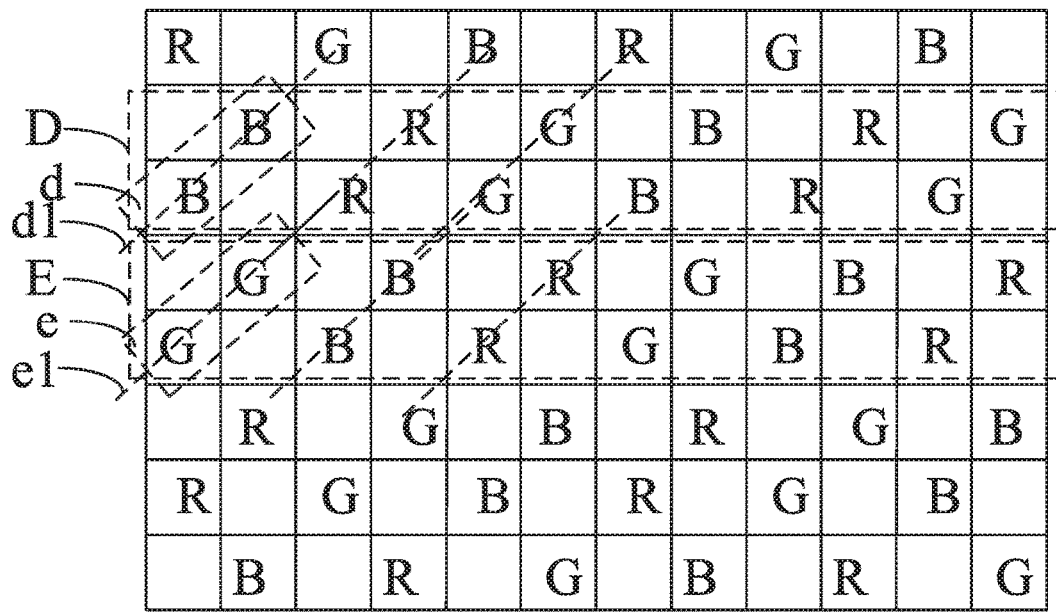
FIG. 3 is a schematic structural diagram of a sub-pixel structure of an organic light emitting diode pixel arrangement structure according to a third embodiment of the present disclosure.

The embodiments described herein with reference to the accompanying drawings are explanatory, illustrative, and used to generally understand the present disclosure. Furthermore, directional terms described by the present disclosure, such as top, bottom, front, rear, left, right, inner, outer, side, etc., are only directions by referring to the accompanying drawings, and thus the used terms are used only for the purpose of describing embodiments of the present disclosure and are not intended to be limiting of the present disclosure.

In the drawings, modules with similar structures are labeled with the same reference number.

Figures 1, 2:
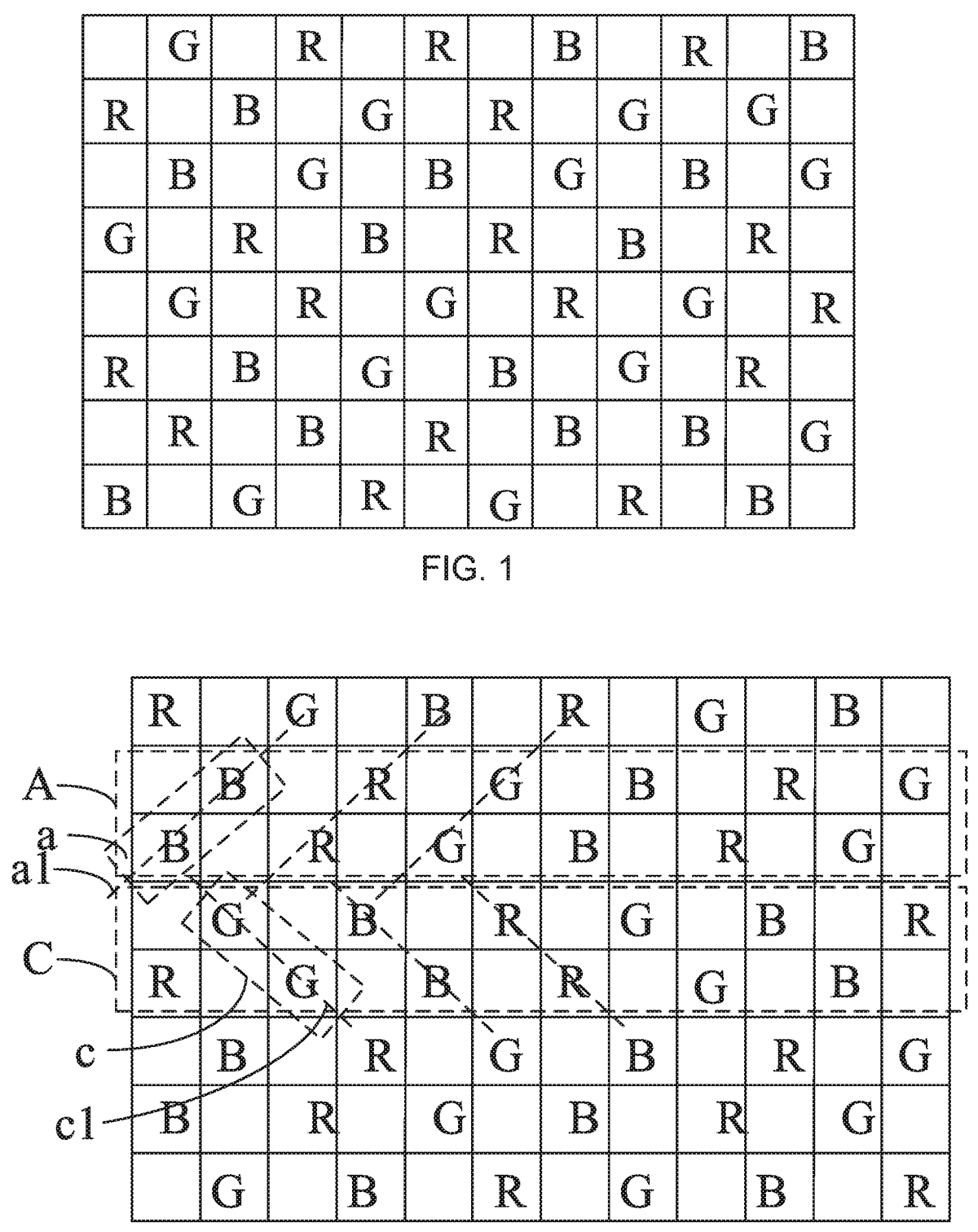

Refer to FIG. 1, a schematic diagram of a sub-pixel structure of a first embodiment of an organic light emitting diode pixel array structure according to the present disclosure is provided. The organic light emitting diode pixel arrangement structure of the embodiment includes a central area in a middle of a display panel and an edge area located around the central area. It can be understood that a number of pixels of an actual display panel is much greater than that illustrated in FIG. 1. A shape of the display panel maybe not necessarily a regular rectangular structure. For example, in IPHONE X, four corners of the display panel are arc-shaped with a notch above. Similarly, a pixel arrangement on the actual display panel maybe not necessarily have the appearance in FIG. 1, and only an arrangement rule of each sub-pixel is illustrated here and in subsequent drawings.

The edge area may correspond to a portion where a plurality of rows or columns of sub-pixels are located around a display area of the display panel, and the central area may correspond to the display area of the display panel other than the edge area.

The organic light emitting diode pixel array structure includes a plurality of sub-pixels arranged in an array. For convenience of description, all the sub-pixels are arranged in an array of rows and columns in the embodiment, that is, all the sub-pixels are arranged in rows in coordinates and columns in abscissas. However, in other embodiments, a coordinate system arranged by the sub-pixels can be rotated on the display panel at an angle, that is, an ordinate axis and an abscissa axis of the coordinate system are not necessarily parallel to edges of the display panel.

In order to meet display requirements of the display panel, the sub-pixels are arranged in following rules. In the central area, four sub-pixels are arranged around a corresponding sub-pixel and have at least three different colors, and a color of the corresponding sub-pixel is same as a color of one of the four sub-pixels arranged around the corresponding sub-pixel as illustrated in FIG.

For example, if the display panel has only red, green, blue (RGB), any sub-pixel observation in the central area is selected, for example, R, then in order to satisfy the above arrangement rule, four sub-pixels arranged around the selected sub-pixel R may be RGBG or RGBB. The four sub-pixels can be arranged in an arbitrary sequence around the selected sub-pixel R. Similarly, the four sub-pixels arranged around the selected sub-pixel R also satisfy the above rules.

In details, there are spaces between the sub-pixels on a same row or column. For convenience of description, in the embodiment of the present disclosure, the spaces are named space units, and sub-pixels on adjacent rows or columns correspond to the space units arranged in adjacent rows or columns. In short, an arrangement of the sub-pixels is same as an arrangement of black or white chess on a chess board of an international chess. In the embodiment, although basic requirements for display can already be met, the arrangement of each sub-pixel is not uniform, and there are certain difficulties in designing the arrangement of an array and driving the array, and a display performance is not optimal.

In an embodiment, unit densities of the sub-pixels of various colors in the aforementioned central area are constant, that is, the sub-pixels of each color are repeated in order on the display panel according to a certain rule.

In an embodiment, the organic light emitting diode pixel array structure includes a plurality of repeating units each are defined by the sub-pixels on two adjacent rows. Each repeating unit A includes a plurality of sub-pixel groups a each composed of two adjacent sub-pixels having a same color, center points of the two adjacent sub-pixels of each of the sub-pixel groups a define a straight line, and straight lines a1 defined by the center points of the two adjacent sub-pixels in the sub-pixel groups a in a same repeating unit are parallel to each other. A plurality of the repeating units A may be arranged in the central area in the display panel so that the density of the sub-pixels of each color in the central area is uniform and is arranged regularly. When designing circuit layout of array substrate and driving the array substrate, the array substrate can be designed according to the repeating units A as illustrated in FIG. 2.

In the embodiment, the straight lines defined by the center points of the sub-pixels in the sub-pixel groups of every two adjacent repeating units intersect, such as the straight line a1 of the sub-pixel group a of the repeating unit A and the straight line c1 of the sub-pixel group c of the repeating unit C intersect.

In another embodiment, the straight lines defined by the center points of the sub-pixels in the sub-pixel groups of every two adjacent repeating units are parallel or coincident. The straight line d1 of the sub-pixel group d of the repeating unit D in FIG. 3 and the straight line e1 of the sub-pixel group e of the repeating unit E are parallel or coincident.

Furthermore, in the central area, a light emitting layer of corresponding sub-pixel and sub-pixels arranged around the corresponding sub-pixel having a same color as the corresponding sub-pixel may be formed by sharing one fine metal mask (FMM) opening for vapor deposition. Generally, an OLED display panel includes a substrate, a metal wiring, a TFT device, and an OLED device. The OLED device includes an anode, an organic light emitting layer, and a cathode. When an organic light emitting material is vapor-deposited by sharing one FFM opening, two light emitting layers of two pixels sharing the FFM opening are formed in the same evaporation process. Pixel definition layers corresponding to the two pixels may be connected to each other or may be separated from each other. Such a process method illustrates that organic light emitting layers of two sub-pixels are connected to each other on a structure of the display panel. The organic light emitting layers between the sub-pixels using different FFM openings are separated. When driving the sub-pixels, regardless of whether or not the organic light emitting layers of the sub-pixels are connected, light emission of corresponding sub-pixel can be controlled by current of the light emitting layer of corresponding sub-pixel region, so as to reduce accuracy of the FFM, reduce minimum distance between adjacent sub-pixels, reduce costs, and improve resolution of the display panel. The sub-pixels are also easier to achieve in the process.

In the embodiment of the present disclosure, a shape of the sub-pixel is schematically depicted as a square. The shape of the sub-pixel can be adjusted in the actual process as a combination of one or more of a circle, a diamond, and a cross. It is understood, due to the limitation of the precision of the process, formed shape is not strictly a straight line or a right angle at an edge or bend of the display panel, and maybe correspondingly a curve or a rounded corner, which is also a variation that can be understood by a person skilled in the art.

Figure 4:
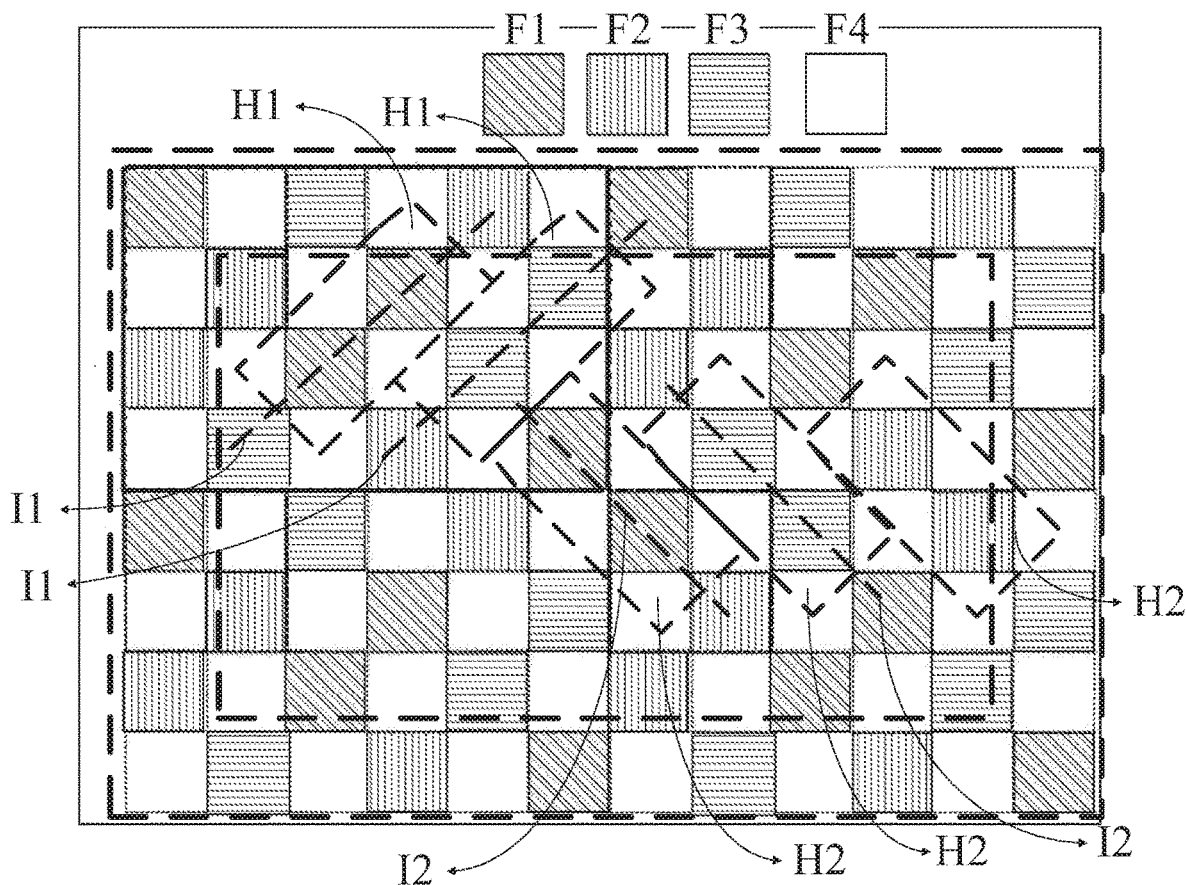
FIG. 4 is a schematic structural diagram of a sub-pixel structure of an organic light emitting diode pixel arrangement structure according to a fourth embodiment of the present disclosure.

Refer to FIG. 4, a schematic diagram of a sub-pixel structure of a fourth embodiment of an organic light emitting diode pixel array structure according to the present disclosure is provided. In the embodiment, the space units F4 each are disposed between every two adjacent sub-pixels on each row, and the sub-pixels on a row adjacent to a corresponding row are disposed in alignment with the space units F4 on the corresponding row, respectively. As illustrated in FIG. 4, top, bottom, left, and right directions of each sub-pixel in the central area are the space units F4. That is, the sub-pixels and adjacent sub-pixels are arranged at intervals by the space units F4.

In the central area, four sub-pixels are arranged around a corresponding sub-pixel and have at least three different colors. In the embodiment, the organic light emitting diode pixel array structure includes red sub-pixels F1, blue sub-pixels F2, and green sub-pixels F3. As illustrated in FIG. 4, red sub-pixels F1 are disposed on a top left of the first blue sub-pixels F2 on a second row, another red sub-pixels F1 are disposed on a bottom right of the first blue sub-pixels F2 on the second row, blue sub-pixels F2 are disposed on the bottom left of the first blue sub-pixels F2 on the second row, and green sub-pixels F3 are disposed on the bottom right of the first blue sub-pixels F2 on the second row. The first blue sub-pixels F2 in the second row are of the same type as the sub-pixels in a bottom left corner, and the blue sub-pixels F2 have red sub-pixels F1, blue sub-pixels F2, and green sub-pixels F3 arranged around the blue sub-pixels F2.

As illustrated in FIG. 4, the organic light emitting diode pixel array structure of the embodiment includes a plurality of repeating units each are defined by the sub-pixels on two adjacent rows. Each repeating unit includes a plurality of sub-pixel groups H1 and H2 each composed of two adjacent sub-pixels having a same color. Center points of the two adjacent sub-pixels of each of the sub-pixel groups define a straight line, and straight lines defined by the center points of the two adjacent sub-pixels in the sub-pixel groups H1 in a same repeating unit are parallel to each other, such as a straight line 11 in FIG. 4.

The straight lines defined by the center points of the sub-pixels in the sub-pixel groups of every two adjacent repeating units intersect, such as the straight line 11 defined by the center points of the sub-pixels in the sub-pixel groups H1 and a straight line 12 defined by the center points of the sub-pixels in the sub-pixel groups H2. The straight line 11 and the straight line 12 intersect.

Adjacent three sub-pixel groups in a same repeating unit includes sub-pixels having three different color being repeated in order. Three sub-pixel groups H2 as illustrated in FIG. 4 include red sub-pixels F1, blue sub-pixels F2, and green sub-pixels F3, respectively. The three sub-pixel groups H2 are sequentially arranged in a fourth row of sub-pixels and a fifth row of sub-pixels and are repeated in order.

Figure 5:
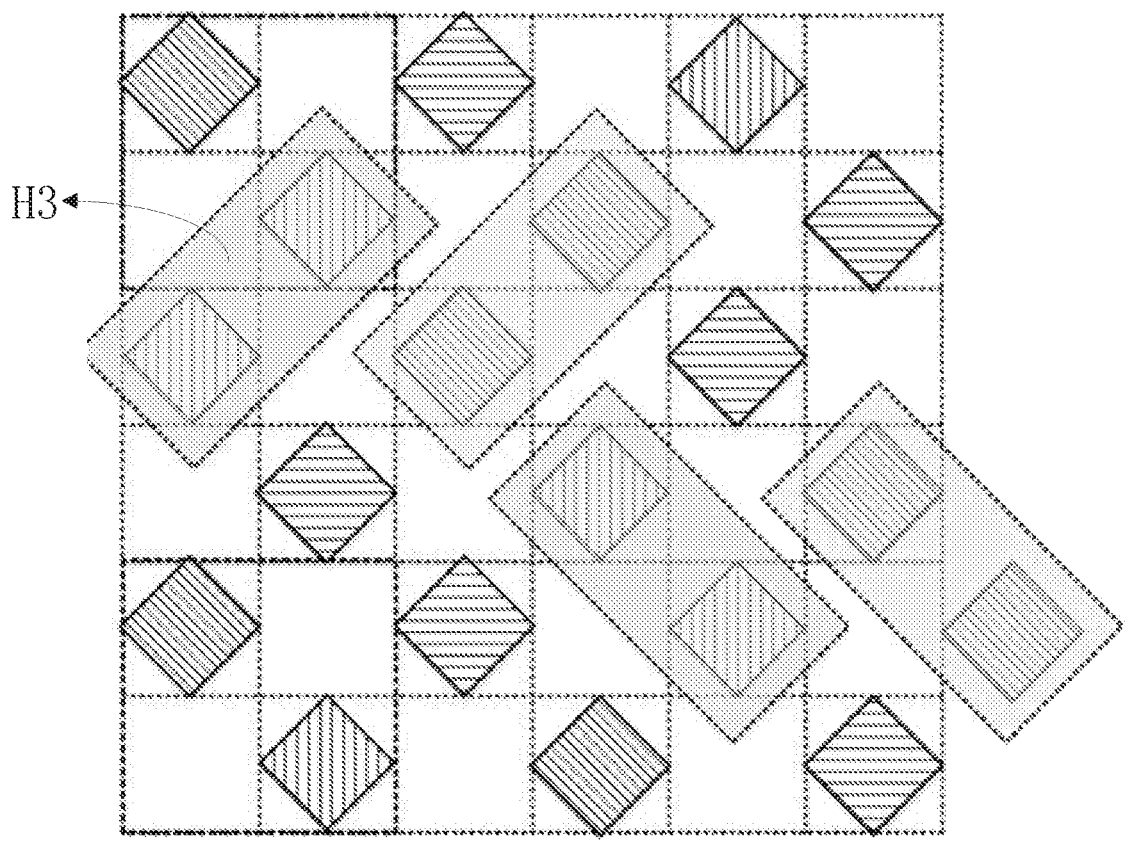
FIG. 5 is a schematic structural diagram of a sub-pixel structure of an organic light emitting diode pixel arrangement structure according to a fifth embodiment of the present disclosure.

In the embodiment, a shape of each of the sub-pixels may be a circle, a rectangle, a square, or a diamond. Refer to FIG. 5, a schematic diagram of a sub-pixel structure of a fifth embodiment of an organic light emitting diode pixel array structure according to the present disclosure is provided. Sub-pixels in the organic light emitting diode array structure of the display panel have a diamond shape.

Specific repeating pixel unit group in the organic light emitting diode pixel arrangement structure of the embodiment may be as illustrated in FIG. 4, and structure of each pixel unit group may be as follow.

In a first row, red sub-pixel F1, space unit F4, green sub-pixel F3, space unit F4, blue sub-pixel F2, and space unit F4 are arranged.

In a second row, space unit F4, blue sub-pixel F2, space unit F4, red sub-pixel F1, space unit F4, and green sub-pixel F3 are arranged.

In a third row, blue sub-pixel F2, space unit F4, red sub-pixel F1, space unit F4, green sub-pixel F3, and space unit F4 are arranged.

In a fourth row, space unit F4, green sub-pixel F3, space unit F4, blue sub-pixel F2, space unit F4, and red sub-pixel F1 are arranged.

When the organic light emitting diode pixel array structure of the embodiment is formed, each sub-pixel includes a cathode, an electron transport layer, a light emitting layer, a hole transport layer, a hole injection layer, and an anode. A light emitting layer of corresponding sub-pixel and light emitting layers of sub-pixels arranged around the corresponding sub-pixel having the same color as the corresponding sub-pixel are connected to each other. The light emitting layers of the two sub-pixels having the same color can be formed using the same fine metal mask, such as sub-pixel group H1 in FIG. 4 and sub-pixel group H3 in FIG. 5, so that an opening distance between the sub-pixels of different colors can be reduced, and resolution of corresponding display panel can be improved.

An embodiment of the present disclosure further provides a display panel including the organic light emitting diode pixel arrangement structure. The organic light emitting diode pixel arrangement structure includes a central area, an edge area located around the central area, and a plurality of sub-pixels arranged in an array. In the central area, four sub-pixels are arranged around a corresponding sub-pixel and have at least three different colors, and a color of the corresponding sub-pixel is the same as a color of one of the four sub-pixels arranged around the corresponding sub-pixel.

A light emitting layer of the corresponding sub-pixel and a light emitting layer of one of the four sub-pixel arranged around the corresponding sub-pixel having the same color as the corresponding sub-pixel are connected to each other. The sub-pixels are arranged in an array of rows and columns. The display panel further includes a plurality of space units. The space units each are disposed between every two adjacent sub-pixels on each row, and the sub-pixels on a row adjacent to a corresponding row are disposed in alignment with the space units on the corresponding row, respectively. A plurality of repeating units each are defined by the sub-pixels on two adjacent rows. Each repeating unit includes a plurality of sub-pixel groups each composed of two adjacent sub-pixels having a same color, center points of the two adjacent sub-pixels of each of the sub-pixel groups define a straight line, and straight lines defined by the center points of the two adjacent sub-pixels in the sub-pixel groups in a same repeating unit are parallel to each other. The straight lines defined by the center points of the sub-pixels in the sub-pixel groups of every two adjacent repeating units intersect. Adjacent three sub-pixel groups in a same repeating unit include sub-pixels having three different color being repeated in order. A shape of each of the sub-pixels is a circle, a rectangle, a square, or a diamond, and the at least three different colors are red, green, and blue.

The specific working principle of the display panel of the embodiment is the same as or similar to the description of the above-mentioned embodiment of the organic light emitting diode pixel arrangement structure. Please refer to the related description in the embodiment of the above organic light emitting diode pixel arrangement structure.

The organic light emitting diode pixel array structure of the embodiment of the present disclosure can be driven by pixel units. Each of the pixel unit includes first sub-pixels, second sub-pixels, and two space units arranged in a 2-by-2 array. The first sub-pixels and the second sub-pixels are diagonally disposed on both sides of the pixel unit.

Each of the pixel units includes first color sub-pixels (such as red sub-pixels), second color sub-pixels (such as blue sub-pixels), and two sub-pixels of third color sub-pixels (such as green sub-pixels). When each of the pixel units includes the first color sub-pixels and the second color sub-pixels, adjacent pixel units include the third color sub-pixels and the first color sub-pixels, or the third color sub-pixels and the second color sub-pixels. The two sub-pixels of the pixel unit are disposed in the same location in the pixel unit.

The first sub-pixels in each row of the pixel unit are cyclically arranged in order of the first color sub-pixels, the second color sub-pixels, and the third color sub-pixels. The second sub-pixels of the pixel unit in a corresponding row are circularly arranged in order of the second color sub-pixels, the third color sub-pixels, and the first color sub-pixels, or the third color sub-pixels, the first color sub-pixels, and the second color sub-pixels.

Types of first sub-pixels of the pixel unit in adjacent rows and a same column are different. Types of second sub-pixels of the pixel unit in adjacent rows and a same column are different. Types of first sub-pixels of the pixel unit in an odd row and a same column are the same. Types of second sub-pixels of the pixel unit in an odd row and a same column are the same. Types of first sub-pixels of the pixel unit in an even row and a same column are the same. Types of second sub-pixels of the pixel unit in an even row and a same column are the same.

As illustrated in FIG. 5, the first sub-pixels and the second sub-pixels are all diamond-shaped sub-pixels. For example, if type of the second sub-pixels of the pixel units in the mth row and the nth column is the same as type of the first sub-pixels of the pixel units in the m+1th row and the nth column, light emitting layer corresponding to the second sub-pixels of the pixel units in the mth row and the nth column and light emitting layer corresponding to the first sub-pixels of the pixel units in the m+1th column and the nth column are connected to each other. For example, if type of the second sub-pixels of the pixel units in the mth row and the nth column is the same as type of the first sub-pixels of the pixel units in the m+1th row and the n+1th column, light emitting layer corresponding to the second sub-pixels of the pixel units in the mth row and the nth column and light emitting layer corresponding to the first sub-pixels of the pixel units in the m+1th column and the n+1th column are connected to each other.

The organic light emitting diode pixel arrangement structure and the display panel of the embodiment of the present disclosure are arranged using the structure of the sub-pixels and can simultaneously manufacture a plurality of sub-pixels using a same fine metal mask, so as to provide the display panel with high resolution and solve low resolution existing in existing OLED display panel.

The present disclosure has been described with a preferred embodiment thereof. The preferred embodiment is not intended to limit the present disclosure, and it is understood that many changes and modifications to the described embodiment can be carried out without departing from the scope and the spirit of the disclosure that is intended to be limited only by the appended claims.

What is claimed is:

1. An organic light emitting diode pixel arrangement structure, comprising:
   a central area;
   an edge area located around the central area;
   a plurality of sub-pixels arranged in an array; and
   a plurality of space units;
   wherein, in the central area, four sub-pixels are arranged around a corresponding sub-pixel and have at least three different colors, and a color of the corresponding sub-pixel is same as a color of one of the four sub-pixels arranged around the corresponding sub-pixel;
   wherein a light emitting layer of the corresponding sub-pixel and a light emitting layer of one of the four sub-pixels arranged around the corresponding sub-pixel having a same color as the corresponding sub-pixel are connected to each other;
   wherein the sub-pixels are arranged in an array of rows and columns;
   wherein the space units each are disposed between every two adjacent sub-pixels on each row, and the sub-pixels on a row adjacent to a corresponding row are disposed in alignment with the space units on the corresponding row, respectively; and
   wherein a shape of each of the sub-pixels is a circle, a rectangle, a square, or a diamond, and the at least three different colors are red, green, and blue.

2. The organic light emitting diode pixel arrangement structure according to claim 1, wherein a plurality of repeating units each are defined by the sub-pixels on two adjacent rows, each repeating unit comprises a plurality of sub-pixel groups each composed of two adjacent sub-pixels having a same color, center points of the two adjacent sub-pixels of each of the sub-pixel groups define a straight line, and straight lines defined by the center points of the two adjacent sub-pixels in the sub-pixel groups in a same repeating unit are parallel to each other.

3. The organic light emitting diode pixel arrangement structure according to claim 2, wherein the straight lines defined by the center points of the sub-pixels in the sub-pixel groups of every two adjacent repeating units intersect.

4. The organic light emitting diode pixel arrangement structure according to claim 3, wherein adjacent three sub-pixel groups in a same repeating unit comprise sub-pixels having three different colors being repeated in order.

5. An organic light emitting diode pixel arrangement structure, comprising:
   a central area;
   an edge area located around the central area; and
   a plurality of sub-pixels arranged in an array;
   wherein, in the central area, four sub-pixels are arranged around a corresponding sub-pixel and have at least three different colors, and a color of the corresponding sub-pixel is same as a color of one of the four sub-pixels arranged around the corresponding sub-pixel.

6. The organic light emitting diode pixel arrangement structure according to claim 5, wherein a light emitting layer of the corresponding sub-pixel and a light emitting layer of one of the four sub-pixels arranged around the corresponding sub-pixel having a same color as the corresponding sub-pixel are connected to each other.

7. The organic light emitting diode pixel arrangement structure according to claim 5, wherein the sub-pixels are arranged in an array of rows and columns.

8. The organic light emitting diode pixel arrangement structure according to claim 7, further comprising a plurality of space units, wherein the space units each are disposed between every two adjacent sub-pixels on each row, and the sub-pixels on a row adjacent to a corresponding row are disposed in alignment with the space units on the corresponding row, respectively.

9. The organic light emitting diode pixel arrangement structure according to claim 8, wherein a plurality of repeating units each are defined by the sub-pixels on two adjacent rows, each repeating unit comprises a plurality of sub-pixel groups each composed of two adjacent sub-pixels having a same color, center points of the two adjacent sub-pixels of each of the sub-pixel groups define a straight line, and straight lines defined by the center points of the two adjacent sub-pixels in the sub-pixel groups in a same repeating unit are parallel to each other.

10. The organic light emitting diode pixel arrangement structure according to claim 9, wherein the straight lines defined by the center points of the sub-pixels in the sub-pixel groups of every two adjacent repeating units intersect.

11. The organic light emitting diode pixel arrangement structure according to claim 10, wherein adjacent three sub-pixel groups in a same repeating unit comprise sub-pixels having three different colors being repeated in order.

12. The organic light emitting diode pixel arrangement structure according to claim 5, wherein a shape of each of the sub-pixels is a circle, a rectangle, a square, or a diamond, and the at least three different colors are red, green, and blue.

13. A display panel, comprising an organic light emitting diode pixel arrangement structure, the organic light emitting diode pixel arrangement structure, comprising:
   a central area;
   an edge area located around the central area; and
   a plurality of sub-pixels arranged in an array;
   wherein, in the central area, four sub-pixels are arranged around a corresponding sub-pixel and have at least three different colors, and a color of the corresponding sub-pixel is same as a color of one of the four sub-pixels arranged around the corresponding sub-pixel.

14. The display panel according to claim 13, wherein a light emitting layer of the corresponding sub-pixel and a light emitting layer of one of the four sub-pixel arranged around the corresponding sub-pixel having a same color as the corresponding sub-pixel are connected to each other.

15. The display panel according to claim 13, wherein the sub-pixels are arranged in an array of rows and columns.

16. The display panel according to claim 15, further comprising a plurality of space units, wherein the space units each are disposed between every two adjacent sub-pixels on each row, and the sub-pixels on a row adjacent to a corresponding row are disposed in alignment with the space units on the corresponding row, respectively.

17. The display panel according to claim 16, wherein a plurality of repeating units each are defined by the sub-pixels on two adjacent rows, each repeating unit comprises a plurality of sub-pixel groups each composed of two adjacent sub-pixels having a same color, center points of the two adjacent sub-pixels of each of the sub-pixel groups define a straight line, and straight lines defined by the center points of the two adjacent sub-pixels in the sub-pixel groups in a same repeating unit are parallel to each other.

18. The display panel according to claim 17, wherein the straight lines defined by the center points of the sub-pixels in the sub-pixel groups of every two adjacent repeating units intersect.

19. The display panel according to claim 18, wherein adjacent three sub-pixel groups in a same repeating unit comprise sub-pixels having three different color being repeated in order.

20. The display panel according to claim 13, wherein a shape of each of the sub-pixels is a circle, a rectangle, a square, or a diamond, and the at least three different colors are red, green, and blue.

* * * * *